United States Patent
Saeki et al.

[11] Patent Number: 5,773,912
[45] Date of Patent: Jun. 30, 1998

[54] PIEZOELECTRIC RESONATOR INCLUDING OSCILLATION BUFFER MATERIALS

[75] Inventors: Seiji Saeki, Namerlkawa; Yoshiharu Kuroda, Toyama, both of Japan

[73] Assignee: Murata Manufacturing Co., Ltd., Kyoto, Japan

[21] Appl. No.: 764,970

[22] Filed: Dec. 13, 1996

[30]     Foreign Application Priority Data

Dec. 19, 1995  [JP]  Japan .................................. 7-330783

[51] Int. Cl.$^6$ .............................. H01L 41/08; H03H 9/17
[52] U.S. Cl. ........................................... 310/326; 310/312
[58] Field of Search .................................. 310/312, 320, 310/321, 326

[56]              References Cited

U.S. PATENT DOCUMENTS

| | | | |
|---|---|---|---|
| 3,317,761 | 5/1967 | Spears | 310/312 |
| 3,376,521 | 4/1968 | Traub | 333/71 |
| 3,571,632 | 3/1971 | De Jong | 310/312 |
| 3,585,418 | 6/1971 | Koneval | 310/312 |
| 4,211,947 | 7/1980 | Ikeno et al. | 310/312 |
| 4,262,227 | 4/1981 | Ikeno et al. | 310/312 |
| 4,356,421 | 10/1982 | Shimizu et al. | 310/320 |
| 4,894,577 | 1/1990 | Okamoto et al. | 310/320 |
| 5,032,755 | 7/1991 | Witte | 310/312 |
| 5,399,997 | 3/1995 | Yoshida | 331/158 |

FOREIGN PATENT DOCUMENTS 1918495  3/1993  Germany.

*Primary Examiner*—Thomas M. Dougherty
*Attorney, Agent, or Firm*—Graham & James LLP

[57]              ABSTRACT

A piezoelectric resonator has oscillating electrodes disposed on opposite major surfaces of a piezoelectric substrate, which oscillating electrodes are arranged so as to extend from respective opposite ends of the piezoelectric substrate to a central portion of the piezoelectric substrate so that the central portions of the oscillating electrodes overlap with each other, with the oscillating substrate sandwiched between the oscillating electrodes. Oscillation buffer materials are disposed on portions of the opposite major surfaces of the piezoelectric substrate, which portions are displaced by the third harmonic oscillation having a frequency which is substantially equal to about three times the resonance frequency of the piezoelectric substrate.

10 Claims, 4 Drawing Sheets

PIEZOELECTRIC RESONATOR INCLUDING OSCILLATION BUFFER MATERIALS

BACKGROUND OF THE INVENTION

1. Field of the Invention

The present invention relates to piezoelectric resonators used in various types of high frequency filters, and more specifically to a piezoelectric resonator including oscillation buffer materials arranged to prevent generation of resonance third harmonics.

2. Description of the Related Art

As a conventional example, a piezoelectric resonator as shown in FIG. 4 is known. This piezoelectric resonator 20 has oscillating electrodes 22A and 22B disposed on opposite major surfaces of a piezoelectric substrate 21. These oscillating electrodes 22A and 22B are formed to extend from opposite ends so that they overlap at a central portion of the piezoelectric substrate 21 so that the piezoelectric substrate 21 is sandwiched therebetween. A high frequency signal applied to the oscillating electrodes 22A and 22B enables the piezoelectric resonator 20 to resonate.

When an electrode having a shape such as that of a partial excitation electrode which is adapted to optimize the excitation of the fundamental resonance wave is used in such a conventional piezoelectric resonator having the above structure, the size and shape of each of the electrodes is increased relative to the third harmonic, which thus raises a problem as not only the third harmonic in the S0 mode but the resonance third harmonics in the S1 mode and the S2 mode which have different phases are also generated. The resonance third harmonics which are generated are extremely disadvantageous because they cause deterioration in the resonance characteristics of the resonator. The conventional resonators have not provided a solution for suppressing the resonance third harmonics without affecting the characteristics of the fundamental resonance wave.

SUMMARY OF THE INVENTION

To eliminate the problems described above, the preferred embodiments of the present invention provide a piezoelectric resonator in which the resonance characteristics thereof are enhanced by preventing the generation of the resonance third harmonics.

The foregoing advantage is achieved through the provision of a piezoelectric resonator having oscillating electrodes disposed on opposite surfaces of a piezoelectric substrate, the oscillating electrodes being arranged so as to extend from respective opposite ends of the piezoelectric substrate to a central portion of the piezoelectric substrate so that the central portions of the oscillating electrodes overlap each other with the oscillating substrate sandwiched between the oscillating electrodes, wherein oscillation buffer materials are disposed on the portions of the two opposite surfaces of the piezoelectric substrate, which portions are displaced by the third harmonic oscillation having a frequency substantially equal to about three times the resonance frequency of the piezoelectric substrate.

According to the preferred embodiments of the present invention, the generation of the S1 and the S2 mode resonance third harmonics which displace both ends of a substrate is suppressed by oscillation buffer materials, whereby, the third harmonics are suppressed without the characteristics of the fundamental resonance wave being affected, so that the resonance characteristics are improved by the amount of such suppression.

In addition, the third harmonic oscillation can be efficiently suppressed by adjusting the natural oscillation frequency of the oscillation buffer material which is determined from both the speed of sound as a constant determined by the type of the oscillation buffer material and the shape of the oscillation buffer material, so that the natural oscillation frequency of the buffer material substantially agrees with the frequency of the third harmonic oscillation which is substantially equal to about three times the resonance frequency of the piezoelectric resonator.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

By referring to the attached drawings, preferred embodiments of the present invention will be described below.

Figure 1:
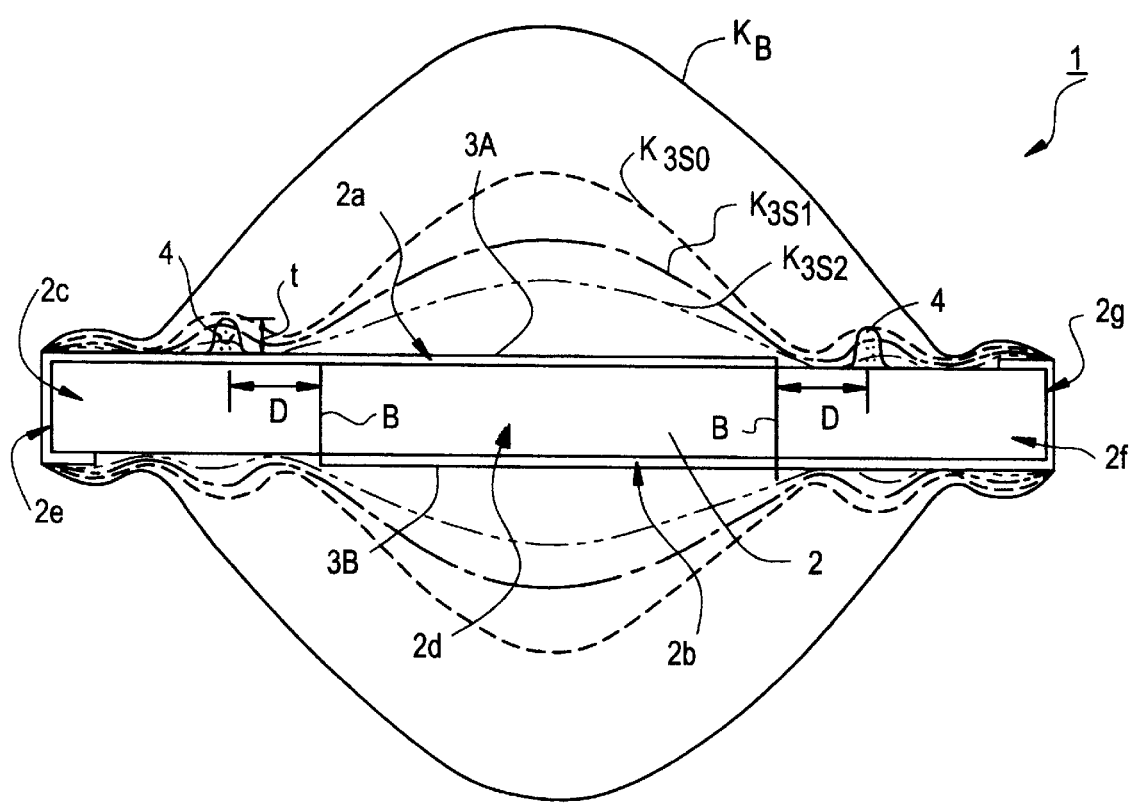
FIG. 1 is a section view illustrating the structure of a piezoelectric resonator according to a preferred embodiment of the present invention.

FIG. 1 shows the structure of a piezoelectric resonator 1 according to a preferred embodiment of the present invention. This piezoelectric resonator 1 preferably has a piezoelectric substrate 2 and oscillating electrodes 3A and 3B. One surface 2a of the piezoelectric substrate 2 is provided with the oscillating electrode 3A, while the other surface 2b is provided with the oscillating electrode 3B. The oscillating electrode 3A is formed so as to extend from one end 2c of the piezoelectric substrate 2 to a central portion 2d of the piezoelectric substrate 2, with the oscillating electrode 3A at the end 2c extending over the end surface 2e of the piezoelectric substrate 2. The oscillating electrode 3B is formed so as to extend from another end 2f which is opposite to the end 2c to the central portion 2d, with the oscillating electrode 3B at another end 2f extending over another end surface 2g of the piezoelectric substrate 2. In addition, the oscillating electrodes 3A and 3B overlap each other at the central portion 2d, with the piezoelectric substrate 2 sandwiched therebetween.

Subsequently, the structure of the piezoelectric resonator 1 will be described. The piezoelectric resonator 1 preferably has oscillation buffer materials 4 respectively disposed at preferably the opposed ends 2c and 2f of the piezoelectric electrode 2. The oscillation buffer materials 4 preferably comprise insulating resins which do not include conductive fillers and are preferably disposed on the surface 2a of the substrate. The locations at which the oscillation buffer materials 4 are disposed on the opposed ends 2c and 2f are determined as described in the following paragraphs.

In the piezoelectric resonator 1, not only the fundamental resonance wave $K_B$ but also the resonance wave $K_3$ which has a frequency substantially equal to about three times that of the wave fundamental resonance wave KB is generated.

When the resonance electrodes 3A and 3B are formed so as to optimize the fundamental resonance wave $K_B$ (see the conventional example shown in FIGS. 3A and 3B), the S1 mode resonance $K_{3S1}$ and the S2 mode resonance $K_{3S2}$ are generated, as well as the S0 mode resonance $K_{3S0}$ which is the third harmonic resonance $K_3$. Conditions of displacement caused by the third harmonic resonances $K_{3S0}$, $K_{3S1}$, and $K_{3S2}$ having different phases on the piezoelectric substrate 2 are shown in FIG. 1. Although the third harmonic resonances $K_{3S0}$, $K_{3S1}$ and $K_{3S2}$ cause the maximum displacement in the central portion 2d of the substrate, the forms in which the displacements are concentrated are respectively different. That is, compared with the S0 mode third harmonic resonance $K_{3S0}$ which causes displacement concentrated in the central portion of the substrate, the S1 mode third harmonic resonance $K_{3S0}$ and the S2 mode third harmonic resonance $K_{3S2}$ cause displacement to some extent at the opposed ends 2c and 2f. In FIG. 1, an alternate long and short dashed line represents the S1 mode third harmonic resonance $K_{3S1}$, an alternate long and two short dashed line represents the S2 mode third harmonic resonance $K_{3S2}$, and a dashed line represents the condition of displacement caused by the S0 mode third harmonic resonance $K_{3S0}$. Also, a solid line represents the condition of displacement caused by the fundamental resonance wave $K_B$.

The oscillation buffer materials 4, which preferably have relatively small mass, are preferably disposed on the surface 2a at the opposed ends 2c and 2f where displacement occurs due to the S1 mode third harmonic resonance $K_{3S1}$ and the S2 mode third harmonic resonance $K_{3S2}$. The oscillation buffer materials 4 suppress or prevent the generation of the S1 mode third harmonic resonance $K_{3S1}$ and the S2 mode third harmonic resonance $K_{3S2}$.

The definite locations at which the oscillation buffer materials 4 are disposed are described in the following paragraph.

The oscillation buffer materials 4 are preferably disposed at positions spaced apart from reference positions B by a desired distance D, when the ends of the oscillating electrodes 3A and 3B in the central portion are used as the reference positions B. The desired distance D is preferably set to be substantially equal to one to two times the thickness of the piezoelectric substrate 2.

An example of the locations in which the oscillation buffer materials 4 are preferably disposed is described in the following paragraphs.

A piezoelectric resonator having a piezoelectric substrate 2, which is made of PZT (lead zirconate titanate), preferably about 5.4 mm long, about 0.3 mm thick and adapted to generate a fundamental resonance $K_B$ of 4 MHz, includes oscillating buffer materials 4 having a width of about 0.3 mm at positions spaced apart from the above-mentioned positions B by a distance approximately equal to one to two times the thickness of the piezoelectric substrate 2 (which corresponds to the above distance D). The reason why the oscillation buffer materials 4 are disposed as described above relates to the following relationship: as the oscillation buffer materials 4 are located closer to the location of maximum amplitude of the third harmonic resonance $K_3$ (serving as the antinode for oscillation of the third harmonic resonance $K_3$), a damping effect is created with respect to the third harmonic resonance $K_3$. The location corresponds to the above-mentioned positions spaced apart from the reference position B by the above distance D, at which location the oscillation buffer materials 4 are disposed.

The oscillation buffer materials 4 are preferably made of a resin which does not include conductive fillers. The materials used for the oscillation buffers 4 and the thickness t of the oscillation buffer materials 4 are preferably determined as described in the following paragraphs.

The materials used for the oscillation buffers 4 and their thickness t preferably satisfy the equation F=C/2t, where C represents the speed of sound naturally determined by the oscillation buffer material 4; and F represents the frequency of the third harmonic oscillation, which is approximately equal to about three times the resonance frequency of the piezoelectric resonator 1.

Determination of the oscillation buffer material 4 depends upon several factors. By adjusting the resonance frequency of the oscillation buffer material 4 so it substantially agrees with the frequency of the third harmonic oscillation which is to be attenuated, the third harmonic oscillation can be efficiently reduced. In addition, the characteristic oscillation frequency f of the oscillation buffer material 4 formed on the piezoelectric substrate 2 can be determined using the equation f=C/2t, where C represents the speed of sound naturally determined by the oscillation buffer material 4 and the shape (in particular, the thickness t, preferably in the thickness-slide-oscillation-mode of the piezoelectric resonator 1) of the oscillation buffer material on the piezoelectric substrate 2. Thus, by adjusting the natural oscillation frequency f of the oscillation buffer material 4, which is determined using the equation f 32 C/2t, so it substantially agrees with the frequency of the third harmonic oscillation which is substantially equal to about three times the resonance frequency of the piezoelectric resonator 1, the third harmonic oscillation can be efficiently reduced.

The surface on which the oscillation buffer materials 4 are disposed is not limited to the surface 2a of the piezoelectric substrate 2. Instead, the oscillation buffer materials 4 may be formed on the other surface 2b. It is preferable if the oscillation buffer materials 4 have a relatively small mass.

Figure 2A:
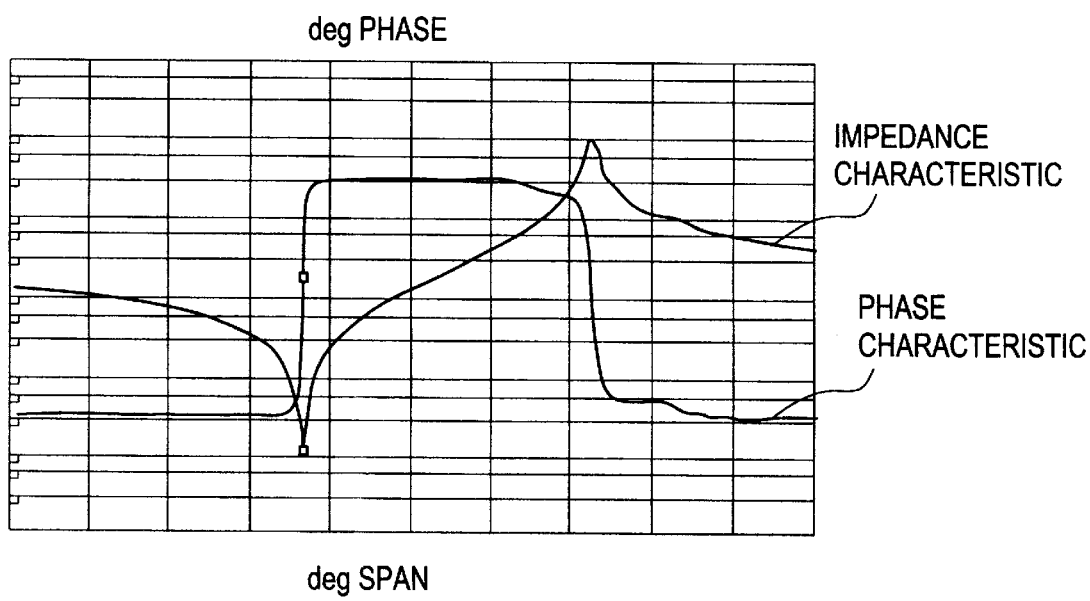
FIGS. 2A and 2B are graphs showing the resonance characteristics according to the preferred embodiment shown in FIG. 1.
Figure 2B:
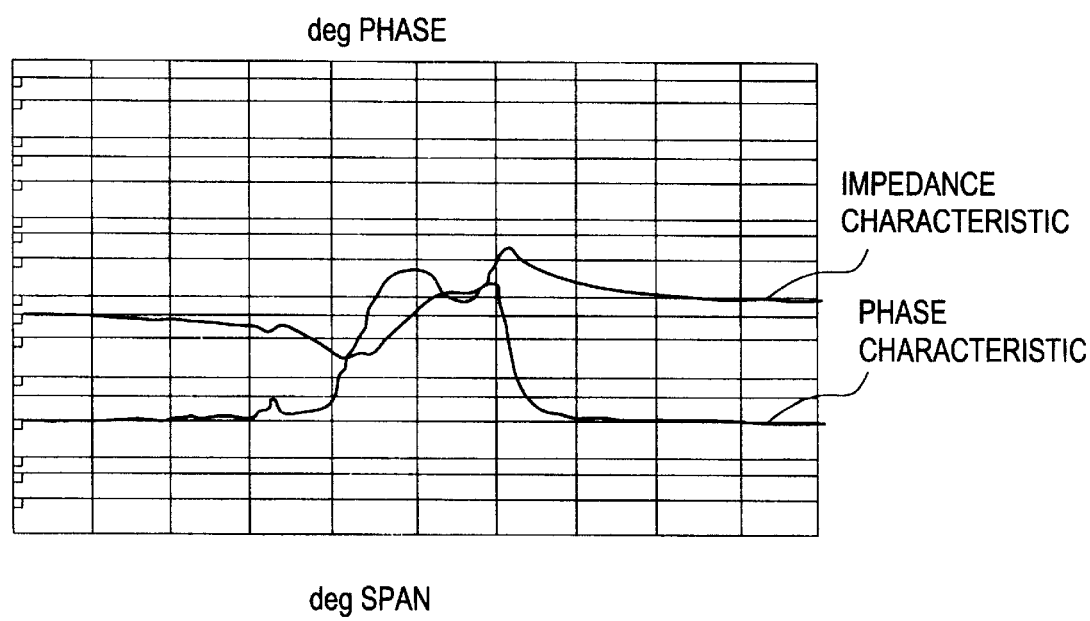
Figure 3A:
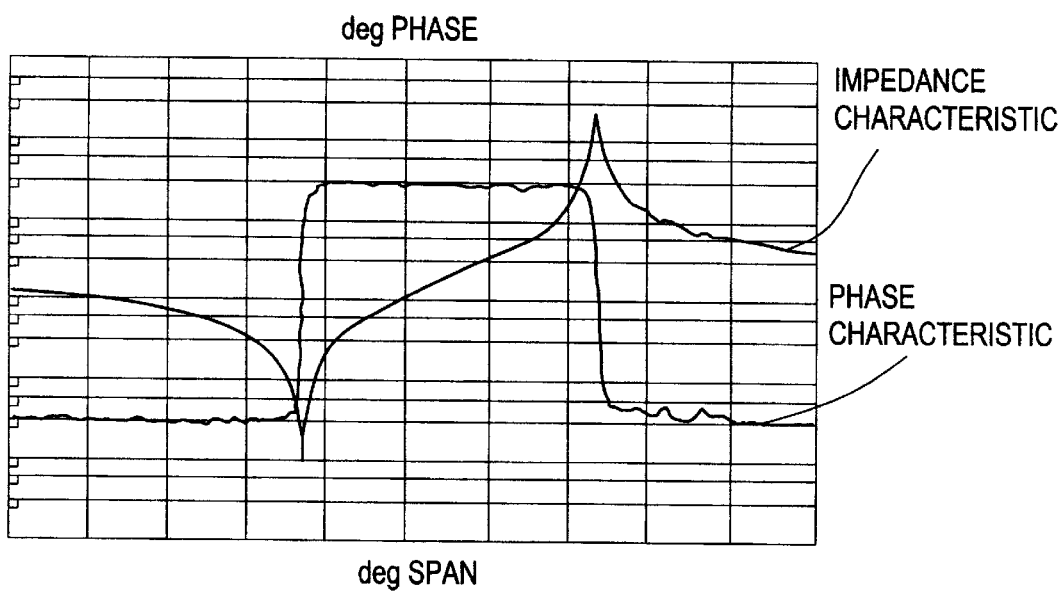
FIGS. 3A and 3B are graphs showing the resonance characteristics according to a conventional resonator.
Figure 3B:
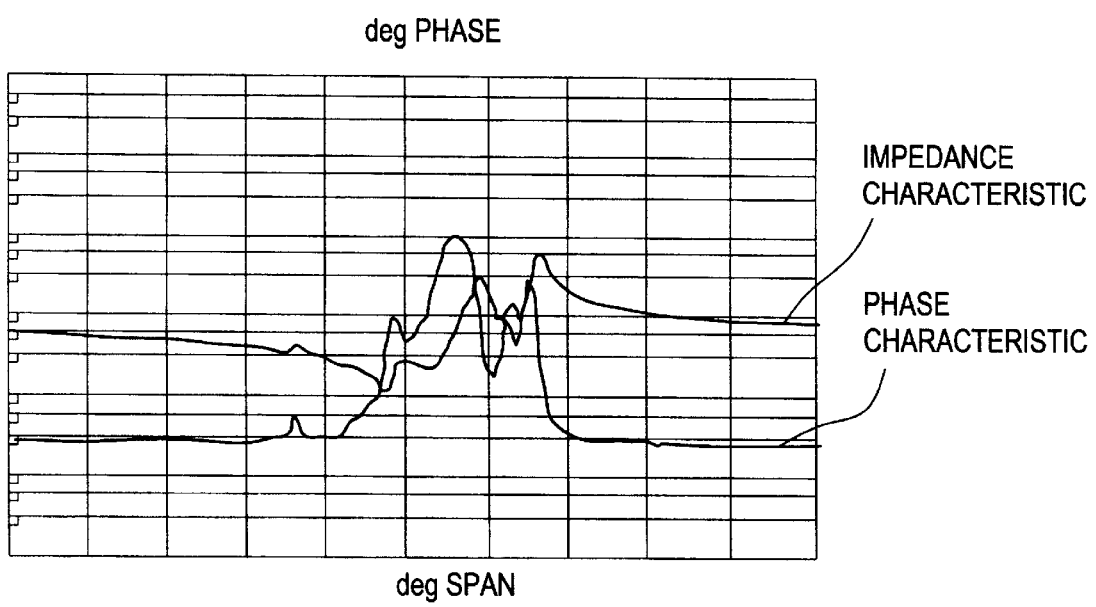
Figure 4:
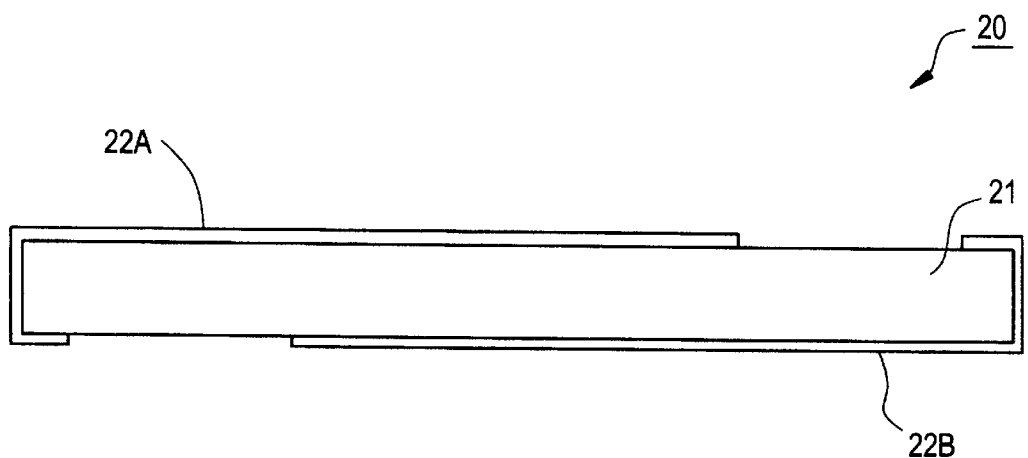
FIG. 4 is a section view illustrating the structure of an example of a conventional piezoelectric resonator.

Subsequently, the results of comparison between the piezoelectric resonator of the preferred embodiments of the present invention and the conventional piezoelectric resonator in resonance characteristics will be described based on FIGS. 2A, 2B and 3A, 3B. FIG. 2A and FIG. 3A show the impedance and phase characteristics of both the piezoelectric resonator according to the preferred embodiments of the present invention and the conventional piezoelectric resonator. FIG. 2B and FIG. 3B show the impedance and phase characteristics of the third harmonics generated by both the piezoelectric resonator according to the preferred embodiments of the present invention and the conventional piezoelectric resonator.

As is apparent from these figures, according to the piezoelectric resonator of the preferred embodiments of the present invention, it can be seen that the resonance third harmonic $K_3$ is controlled such that the resonance third harmonic is not generated and the characteristics of the fundamental resonance wave KB are not deteriorated or affected. This is due to the fact that the S1 and S2 mode resonance third harmonics which displace the substrate ends 2c and 2f are controlled and thus, degenerated due to the oscillation buffer materials 4 located at the ends 2c and 2f.

The reason why only the generation of the resonance third harmonic $K_3$ is selectively suppressed despite the arrangement in which the oscillation buffer materials 4 are disposed at the substrate ends 2c and 2f where displacement also occurs due to the fundamental resonance wave $K_B$ is because, by adjusting the natural oscillation frequency f of the oscillation buffer material 4 so it substantially agrees with the frequency F of the third harmonic oscillation which is substantially equal to about three times the resonance frequency of the piezoelectric resonator 1, the third harmonic oscillation can be efficiently reduced. Another reason is that the fundamental resonance wave $K_B$ is not affected by the oscillation buffer material 4 because it has greater excitation frequency than the resonance third harmonic $K_3$ when both waves are compared.

As described above, by providing the oscillation buffer materials 4 which have relatively small specific gravity in the piezoelectric resonator 1, the generation of the resonance third harmonic $K_3$ can be suppressed without the fundamental resonance wave $K_3$ being affected.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator comprising:

a piezoelectric substrate having opposite major surfaces;

oscillating electrodes disposed on said opposite major surfaces of said piezoelectric substrate, said oscillating electrodes being arranged so as to extend from respective opposed ends of said piezoelectric substrate to a central portion of said piezoelectric substrate so that said oscillating electrodes overlap each other at the central portion of said piezoelectric substrate with said piezoelectric substrate sandwiched between said oscillating electrodes; and an oscillation buffer material disposed on a portion of at least one of said opposite major surfaces of said piezoelectric substrate, which portion is displaced by a third harmonic oscillation having a frequency substantially equal to about three times a resonance frequency of said piezoelectric substrate, the oscillation buffer material having a natural resonant frequency which is substantially the same as the frequency of said third harmonic oscillation such that the oscillation buffer material prevents generation of said third harmonic oscillation.

2. A piezoelectric resonator according to claim 1, wherein said oscillation buffer material comprises insulating resin.

3. A piezoelectric resonator according to claim 1, wherein a composition and a thickness of said oscillation buffer material are determined so as to satisfy the equation:

$$F=C/2t$$

where t represents a thickness of said oscillation buffer material; C represents a speed of sound naturally determined by the composition of said oscillation buffer material; and F represents a frequency of the third harmonic oscillation which is substantially equal to three times said resonance frequency.

4. A piezoelectric resonator according to claim 1, wherein the oscillation buffer material is disposed on each of said opposite major surfaces of said piezoelectric substrate.

5. A piezoelectric resonator comprising:

a piezoelectric substrate having opposite major surfaces;

a pair of oscillating electrodes each being disposed on one of said opposite major surfaces of said piezoelectric substrate; and an oscillation buffer material made of an insulating resin material and disposed on one of said opposite major surfaces of said piezoelectric substrate, the oscillation buffer material being disposed only at end portions of the piezoelectric substrate at locations where displacement occurs due to third order harmonics, to suppress a third harmonic oscillation having a frequency substantially equal to about three times a resonance frequency of said piezoelectric substrate.

6. A piezoelectric resonator according to claim 5, wherein the piezoelectric substrate is arranged such that the third harmonic oscillation is suppressed without suppressing a fundamental resonance wave of said piezoelectric substrate.

7. A piezoelectric resonator according to claim 5, wherein the oscillation buffer material is disposed on said one of said opposite major surfaces of said piezoelectric substrate for suppressing said third harmonic oscillation such that said oscillation buffer material is symmetrically disposed at at least two locations spaced at a distance from each end of the one of said pair of oscillating electrodes on said one of said opposite major surfaces of said piezoelectric substrate.

8. A piezoelectric resonator according to claim 7, wherein said oscillation buffer material comprises insulating resin.

9. A piezoelectric resonator according to claim 7, wherein a composition and a thickness of said oscillation buffer material are determined so as to satisfy the equation:

$$F=C/2t$$

where t represents a thickness of said oscillation buffer material; C represents a speed of sound naturally determined by the composition of said oscillation buffer material; and F represents a frequency of the third harmonic oscillation which is substantially equal to three times said resonance frequency.

10. A piezoelectric resonator according to claim 8, wherein the oscillation buffer material has a natural resonant frequency which is substantially the same as the frequency of said third harmonic oscillation such that said oscillation buffer material prevents generation of said third harmonic oscillation.

* * * * *